US010110178B2

(12) United States Patent
Kim et al.

(10) Patent No.: US 10,110,178 B2
(45) Date of Patent: Oct. 23, 2018

(54) FREQUENCY SELECTIVE ISOLATION CIRCUIT AND METHOD FOR SUPPRESSING PARAMETRIC OSCILLATION

(71) Applicants: Kevin Kim, Gilbert, AZ (US); Igor Ivanovich Blednov, Toulouse (FR); Olivier Lembeye, Saint Lys (FR); Pascal Peyrot, Frouzins (FR)

(72) Inventors: Kevin Kim, Gilbert, AZ (US); Igor Ivanovich Blednov, Toulouse (FR); Olivier Lembeye, Saint Lys (FR); Pascal Peyrot, Frouzins (FR)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 14/549,756

(22) Filed: Nov. 21, 2014

(65) Prior Publication Data

US 2016/0056765 A1 Feb. 25, 2016

(30) Foreign Application Priority Data

Aug. 20, 2014 (WO) ............... PCT/IB2014/00181

(51) Int. Cl.
| | |
|---|---|
| *H03F 3/68* | (2006.01) |
| *H03F 3/21* | (2006.01) |
| *H03F 1/32* | (2006.01) |
| *H03F 3/195* | (2006.01) |
| *H01L 23/66* | (2006.01) |
| *H03H 7/09* | (2006.01) |
| *H03H 11/04* | (2006.01) |

(52) U.S. Cl.
CPC .............. *H03F 3/211* (2013.01); *H01L 23/66* (2013.01); *H03F 1/32* (2013.01); *H03F 3/195* (2013.01);

(Continued)

(58) Field of Classification Search
CPC ......................................................... H03F 1/02

(Continued)

(56) References Cited

U.S. PATENT DOCUMENTS 5,939,939 A * 8/1999 Gaynor .................. H03F 3/602
330/124 R
5,977,843 A * 11/1999 Watanabe ................ H01P 5/16
333/127

(Continued)

OTHER PUBLICATIONS

Goverdhanam, K. et al. "Distributed effects in high power RF LDMOS transistors", IEEE MTT-S International Microwave Symposium Digest, pp. 827-830, Jun. 2005.

(Continued)

*Primary Examiner* — Khanh V Nguyen
*Assistant Examiner* — Khiem Nguyen

(57) ABSTRACT

In a system comprising a plurality of gain elements configured in parallel to one another, a harmonically tuned filter provides an isolation circuit to prevent odd-mode differential oscillations. A harmonically tuned filter comprises resistors, inductors, and capacitors (RLC) to selectively allow one or more specific harmonics to pass through the isolation circuit to suppress the odd-mode oscillation. Direct current (DC) and other non-harmonically-related frequencies do not pass through the isolation circuit. Since the resistor is used to dissipate specifically the energy of the harmonic frequencies causing the odd-mode oscillation, the current density through the resistor is much lower than the current density of a typical odd-mode resistor without a harmonically tuned filter.

20 Claims, 5 Drawing Sheets

(52) U.S. Cl.
CPC .......... *H01L 2223/6611* (2013.01); *H01L 2223/6644* (2013.01); *H01L 2224/49175* (2013.01); *H03F 2200/165* (2013.01); *H03F 2200/451* (2013.01); *H03F 2203/21106* (2013.01); *H03H 7/09* (2013.01); *H03H 2011/0488* (2013.01); *H03H 2240/00* (2013.01)

(58) Field of Classification Search
USPC .......... 330/124 R, 295, 276, 195, 188
See application file for complete search history.

(56) References Cited

U.S. PATENT DOCUMENTS

| | | | |
|---|---|---|---|
| 6,005,442 A * | 12/1999 | Maeda | H03F 3/604 330/295 |
| 6,201,445 B1 * | 3/2001 | Morimoto | H03F 3/604 330/286 |
| 8,253,495 B2 | 8/2012 | Bouisse | |
| 2001/0004115 A1 | 6/2001 | Olofsson et al. | |
| 2005/0190614 A1 | 9/2005 | Brunette et al. | |
| 2012/0133442 A1 | 5/2012 | Blednov | |
| 2016/0056765 A1 | 2/2016 | Kim et al. | |

OTHER PUBLICATIONS

Breitkreutz, B. et al. "Feeding structures for packaged multifinger power transistors", European Microwave Conference, pp. 146-149, Oct. 2007.

Halder, S. et al. "Bond-wire engineering to improve power performance in multi-cell GaN package devices", IEEE MTT-S International Microwave Symposium Digest, pp. 1-3 Jun. 2013.

* cited by examiner

FREQUENCY SELECTIVE ISOLATION CIRCUIT AND METHOD FOR SUPPRESSING PARAMETRIC OSCILLATION

CROSS REFERENCE TO RELATED APPLICATION(S)

The present application claims priority to International Patent Application No. PCT/IB2014/001841, entitled "FREQUENCY SELECTIVE ISOLATION CIRCUIT AND METHOD FOR SUPPRESSING PARAMETRIC OSCILLATION," filed on Aug. 20, 2014, the entirety of which is herein incorporated by reference.

BACKGROUND

Field of the Disclosure

Multiple transistors placed in parallel can exhibit odd-mode oscillations due to asymmetries in the operations of each parallel transistor. The odd-mode oscillation is typically caused by subharmonics and/or higher harmonics of the fundamental frequency at which the multiple transistors provide amplification. Odd-mode/differential/isolation resistors have been connected between the parallel transistors at the input and/or output to suppress the oscillation. Although the use of an odd-mode resistor is effective in suppressing the oscillation, an odd-mode resistor dissipates energy of the imbalances non-selectively at direct current (DC) and at all frequencies. For high power transistors, the odd-mode resistors at the output encounter reliability issues due to the large amount of current that can go through the resistors. A common reliability issue is a failure of the resistor as it exceeds its operational range.

Large semiconductor dies with which a high power radio frequency (RF) transistor is built represent a large number of transistor cells combined in parallel by a metal bar at the input (e.g., gate) and at the output (e.g., drain), for example, in case of a field effect transistor (FET). The number of cells (e.g., fingers) connected in parallel may be up to 150 on the same die, and the physical length of the combining metal bar may achieve, for example, 5 to 7 millimeters (mm). Another issue presented for high power RF transistors is that such a combining metal bar may be considered to be a transmission line exhibiting distributed inductance (L) and capacitance (C). Thus, the combining metal bar may act as a resonator at certain frequencies. In that case, a standing wave may be created at the metal combining bar at the input or output of the transistor die.

There can be power dependent harmonic content in the output signal. That power dependent harmonic content can vary when the device is operating at a variable conduction angle. For example, class C amplifier operation is characterized by variable conduction angle vs. power level and content of higher harmonics of fundamental frequency (f0), such as 2f0, 3f0, 4f0 etc., while class AB amplifier operation has more linear performance with minimal content of harmonics 3f0 and 4f0, while still having a high level of harmonic 2f0.

At a high level of 2f0 and 3f0 in the output signal, even a small asymmetry in the active die due to process variation between active fingers can result in a standing wave of 2f0 or 3f0 being generated at the output (e.g., at the drain and output combining metal bar). Thus, for example, a non-uniform 2f0 voltage profile can exist along this combining metal bar. In such a case, if the electrical length of the output metal bar at 2f0, for example, is close to 90° of phase angle, then one side of the combining metal bar may show a maximal voltage of 2f0, while the opposite side may show a minimal voltage of 2f0. This may create a non-uniform impedance distribution along the output combining metal bar of the active die at 2f0 and may cause stability issues of the device, which can appear as parametric oscillation or as loop oscillation.

Another issue is that input parasitic capacitances, such as a gate source parasitic capacitance (Cgs) and a gate drain parasitic capacitance (Cgd), and output parasitic capacitances, such as a drain source parasitic capacitance (Cds), of power device technologies (e.g., metal oxide semiconductor (MOS), bipolar junction transistor (BJT), high electron mobility transistor (HEMT), etc.) exhibit non-linear voltage dependency. According to the Manly-Row theory, these capacitances may generate additional frequency components, which do not exist in the spectrum of the original amplified signal, which also may create a non-uniform profile of output voltage along the output combining metal bar of the active die. For example, there may be a non-uniform output voltage distribution at 2f0 along the output combining metal bar.

A typical way to remove undesired energy is cross bonding between active dies in a multi-die device using a resistor, but such an approach tends to result in output power degradation and efficiency degradation of the device.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION OF THE DRAWINGS

Figure 1:
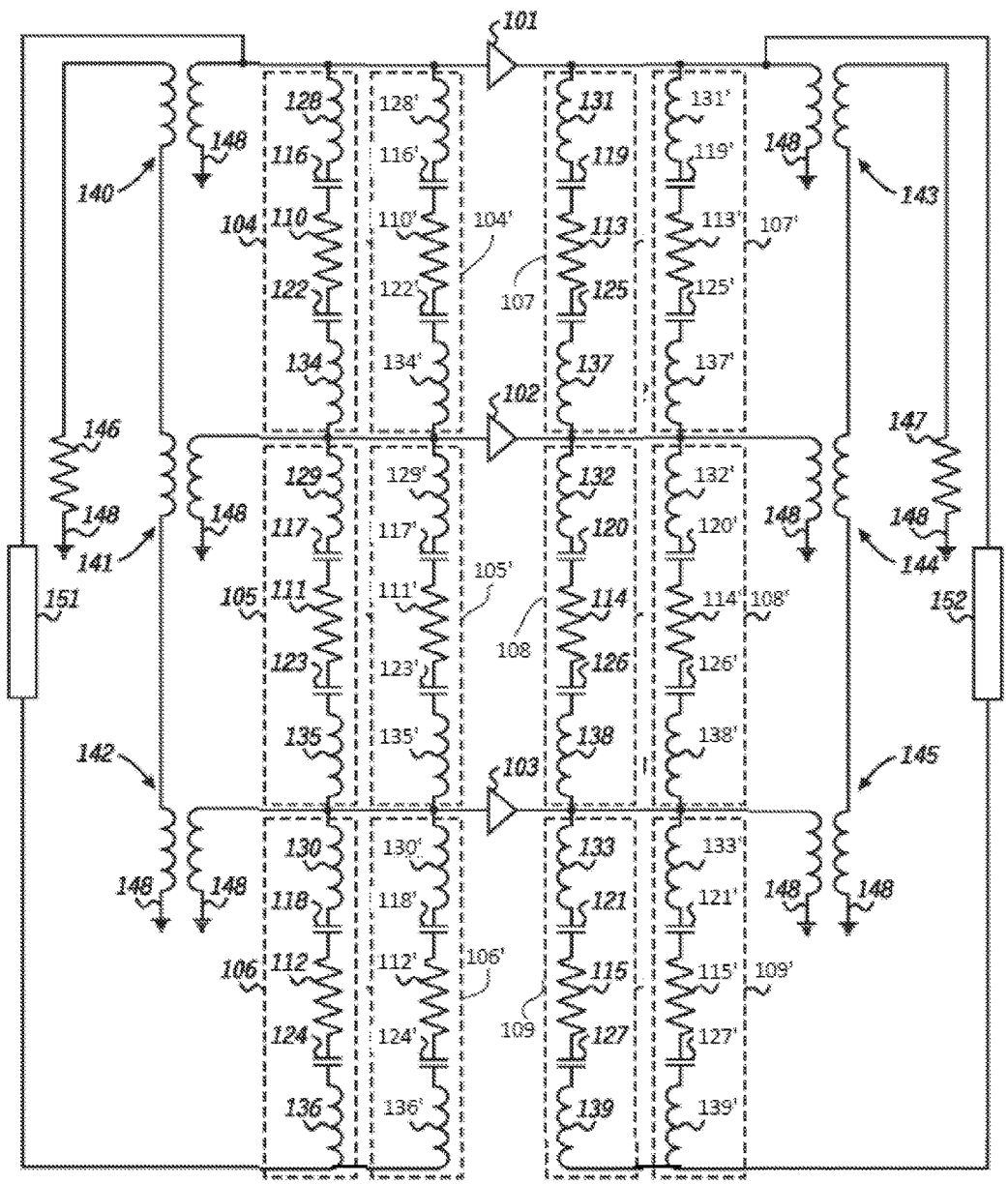
FIG. 1 is a schematic diagram illustrating a system comprising harmonically tuned filters in accordance with at least one embodiment.

In a system comprising a plurality of gain elements configured in parallel to one another, a harmonically tuned filter provides an isolation circuit to prevent or reduce odd-mode differential oscillations. A harmonically tuned filter comprises resistors, inductors, and capacitors (RLC) to selectively allow one or more specific harmonics to pass through the isolation circuit to suppress the odd-mode oscillation. DC and other non-harmonically-related frequencies do not pass through the isolation circuit. Since the resistor is used to dissipate specifically the energy of the harmonic frequencies causing the odd-mode oscillation, the current density through the resistor is much lower than the current density of a typical odd-mode resistor without a harmonically tuned filter. Therefore, the reliability can be improved. To increase the bandwidth of the proposed RLC isolation circuit (e.g., to allow more harmonic frequencies), multiple RLC isolation circuits can be placed in parallel to resonate at specific smaller ranges of harmonics.

The use of harmonically tuned filters between the inputs of amplifier gain elements configured in parallel and between the outputs of such amplifier gain elements may provide filtering of all frequencies except for the harmonic frequencies that would cause odd-mode oscillation. The harmonic frequencies are selected by choosing a combination of inductor (L) and capacitor (C) values of the proposed isolation circuit that resonate at the frequencies that would cause odd-mode oscillation. The resistance value of the RLC isolation circuit may be optimized for the parallel transistor combination. The RLC isolation circuit blocks unnecessary energy (e.g., at DC and at frequencies other than the selected harmonic frequencies) from being dissipated by the resistor of the RLC isolation circuit. Therefore, power dissipation of the resistor is reduced, and resistor reliability is improved.

As the RLC isolation circuit, at its resonant frequency, can provide a resistive impedance yet, at other frequencies, can provide reactive impedances, the RLC isolation circuit can provide frequency selectivity to odd mode suppression. The RLC isolation circuit can equalize an output signal voltage along an output combining metal bar or an input combining metal bar of the active die on one or more specific harmonics of a fundamental signal or on any other frequency for which equalization may be desired. In such a case, all dies of a high power device can generate a more uniform output signal at an output terminal (e.g., a package lead) and avoid conditions of instability at any frequency or particular harmonic of the fundamental including any subharmonic, for example, 2f0/2, f0/2, f0/3, etc., if desired. Thus, harmonically related frequencies can include harmonics having higher frequencies than the fundamental frequency and subharmonics having lower frequencies than the fundamental frequency.

In accordance with at least one embodiment, an integrated resistor and series capacitor are provided on a laterally diffused metal oxide semiconductor (LDMOS) transistor die. Wire bonds with adjustable loop heights are provided in series with the resistor and series capacitor to form a series inductor and to tune the resonant frequencies of the frequency selective isolation circuit. By selectively tuning the inductor and capacitor (LC) values to allow only the energies of the harmonic frequencies that cause the odd-mode/parametric oscillation to be dissipated in the odd-mode resistor, the frequency selective isolation circuit may filter out DC and all radio frequency (RF) energy that is not causing the odd-mode/parametric oscillation, instead passing only the RF energy that would cause the undesired oscillation.

FIG. 1 is a schematic diagram illustrating a system comprising harmonically tuned filters in accordance with at least one embodiment. System 100 comprises at least two amplifiers 101, 102, and 103 configured in parallel with each other. While three amplifiers are illustrated, embodiments may be practiced with any number of at least two amplifiers. System 100 comprises source impedance 146 with respect to ground 148. Source impedance 146 is representative of a signal input, where an input RF signal is applied to the system. Source impedance 146 is connected to a first terminal of a primary winding of input transformer 140 for amplifier 101. A second terminal of the primary winding of input transformer 140 is connected to a first terminal of a primary winding of input transformer 141 for amplifier 102. A second terminal of the primary winding of input transformer 141 is connected to a first terminal of a primary winding of input transformer 142 for amplifier 103. A second terminal of the primary winding of input transformer 142 is connected to ground 148.

A first terminal of a secondary winding of input transformer 140 is connected to an input terminal of amplifier 101. A second terminal of the secondary winding of input transformer 140 is connected to ground 148. A first terminal of a secondary winding of input transformer 141 is connected to an input terminal of amplifier 102. A second terminal of the secondary winding of input transformer 141 is connected to ground 148. A first terminal of a secondary winding of input transformer 142 is connected to an input terminal of amplifier 103. A second terminal of the secondary winding of input transformer 142 is connected to ground 148.

The input terminal of amplifier 101 is connected to a first terminal of input harmonically tuned filter 104. A second terminal of input harmonically tuned filter 104 is connected to the input terminal of amplifier 102. The input terminal of amplifier 102 is connected to a first terminal of input harmonically tuned filter 105. A second terminal of input harmonically tuned filter 105 is connected to the input terminal of amplifier 103. The input terminal of amplifier 103 is connected to a first terminal of input harmonically tuned filter 106. A second terminal of input harmonically tuned filter 106 is connected to the input terminal of amplifier 101. In accordance with at least one embodiment, the second terminal of input harmonically tuned filter 106 is connected to a first terminal of transmission line 151, and a second terminal of transmission line 151 is connected to the input terminal of amplifier 101. Transmission line 151 is discussed in more detail below. In accordance with at least one embodiment, such as an embodiment where amplifiers 101 and 103 are disposed at opposite ends of a physical structure with one or more amplifiers 102 disposed between them (e.g., as in the embodiment of FIG. 5), harmonically tuned filter 106 and transmission line 151 can be omitted.

An output terminal of amplifier 101 is connected to a first terminal of output harmonically tuned filter 107. A second terminal of output harmonically tuned filter 107 is connected to an output terminal of amplifier 102. The output terminal of amplifier 102 is connected to a first terminal of output harmonically tuned filter 108. A second terminal of output harmonically tuned filter 108 is connected to an output terminal of amplifier 103. The output terminal of amplifier 103 is connected to a first terminal of output harmonically tuned filter 109. A second terminal of output harmonically tuned filter 109 is connected to the output terminal of amplifier 101. In accordance with at least one embodiment, the second terminal of output harmonically tuned filter 109 is connected to a first terminal of transmission line 152, and a second terminal of transmission line 152 is connected to the output terminal of amplifier 101. Transmission line 152 is discussed in more detail below. In accordance with at least one embodiment, such as an embodiment where amplifiers 101 and 103 are disposed at opposite ends of a physical structure with one or more amplifiers 102 disposed between them (e.g., as in the embodiment of FIG. 5), harmonically tuned filter 109 and transmission line 152 can be omitted.

In accordance with at least one embodiment, at least one of transmission lines 151 and 152 is included in the system. Such an embodiment may be implemented, for example, where amplifier 101 and amplifier 103 are physically located farthest from each other among the amplifiers in the system (e.g., wherein amplifier 102 and any other amplifiers are physically located between amplifier 101 and amplifier 103). For example, amplifier 101 and amplifier 103 can be located at opposite ends of an input combining metal bar at the input to the amplifiers and at opposite ends of an output combining metal bar at the output of the amplifiers. Transmission lines 151 and 152 are configured to have an electrical length of $(n*360)°$ (e.g., an integer multiple of 360 degrees of phase angle) at a selected harmonic or frequency to suppress such selected harmonic or frequency between outer sides of lateral active dies (e.g., active dies located farthest from each other among the active dies of a multi-die power device). As one example, transmission lines 151 and 152 can be located inside a packaged device in which the system is implemented. As another example, transmission lines 151 and 152 can be located outside of a packaged device in which the system is implemented. Accordingly, inclusion of at least one of transmission lines 151 and 152 can further suppress an undesirable standing wave within a multi-die power device.

The output terminal of amplifier 101 is connected to a first terminal of a primary winding of output transformer 143. A second terminal of the primary winding of output transformer 143 is connected to ground 148. The output terminal of amplifier 102 is connected to a first terminal of a primary winding of output transformer 144. A second terminal of the primary winding of output transformer 144 is connected to ground 148. The output terminal of amplifier 103 is connected to a first terminal of a primary winding of output transformer 145. A second terminal of the primary winding of output transformer 145 is connected to ground 148.

A first terminal of a secondary winding of output transformer 143 is connected to a first terminal of load impedance 147. A second terminal of load impedance 147 is connected to ground 148. Load impedance 147 is representative of signal output, where an amplified output RF signal is obtained from the system. A second terminal of the secondary winding of output transformer 143 is connected to a first terminal of a secondary winding of output transformer 144. A second terminal of the secondary winding of output transformer 144 is connected to a first terminal of a secondary winding of output transformer 145. A second terminal of the secondary winding of output transformer 145 is connected to ground 148.

Input harmonically tuned filter 104 is tuned to pass harmonic frequencies that would tend to cause odd-mode oscillation among amplifiers 101 and 102. Input harmonically tuned filter 104 comprises at least one reactive component, such as inductor 128, capacitor 116, capacitor 122, and inductor 134. Input harmonically tuned filter 104 can also comprise at least one resistive component, such as resistor 110. In the particular embodiment illustrated in FIG. 1, the first terminal of input harmonically tuned filter 104 is connected to a first terminal of inductor 128. A second terminal of inductor 128 is connected to a first terminal of capacitor 116. A second terminal of capacitor 116 is connected to a first terminal of resistor 110. A second terminal of resistor 110 is connected to a first terminal of capacitor 122. A second terminal of capacitor 122 is connected to a first terminal of inductor 134. A second terminal of inductor 134 is connected to the second terminal of input harmonically tuned filter 104.

Input harmonically tuned filter 105 is tuned to pass harmonic frequencies that would tend to cause odd-mode oscillation among amplifiers 102 and 103. Input harmonically tuned filter 105 comprises at least one reactive component, such as inductor 129, capacitor 117, capacitor 123, and inductor 135. Input harmonically tuned filter 105 can also comprise at least one resistive component, such as resistor 111. In the particular embodiment illustrated in FIG. 1, the first terminal of input harmonically tuned filter 105 is connected to a first terminal of inductor 129. A second terminal of inductor 129 is connected to a first terminal of capacitor 117. A second terminal of capacitor 117 is connected to a first terminal of resistor 111. A second terminal of resistor 111 is connected to a first terminal of capacitor 123. A second terminal of capacitor 123 is connected to a first terminal of inductor 135. A second terminal of inductor 135 is connected to the second terminal of input harmonically tuned filter 105.

Input harmonically tuned filter 106 is tuned to pass harmonic frequencies that would tend to cause odd-mode oscillation among amplifiers 103 and 101. Input harmonically tuned filter 106 comprises at least one reactive component, such as inductor 130, capacitor 118, capacitor 124, and inductor 136. Input harmonically tuned filter 106 can also comprise at least one resistive component, such as resistor 112. In the particular embodiment illustrated in FIG. 1, the first terminal of input harmonically tuned filter 106 is connected to a first terminal of inductor 130. A second terminal of inductor 130 is connected to a first terminal of capacitor 118. A second terminal of capacitor 118 is connected to a first terminal of resistor 112. A second terminal of resistor 112 is connected to a first terminal of capacitor 124. A second terminal of capacitor 124 is connected to a first terminal of inductor 136. A second terminal of inductor 136 is connected to the second terminal of input harmonically tuned filter 106.

Output harmonically tuned filter 107 is tuned to pass harmonic frequencies that would tend to cause odd-mode oscillation among amplifiers 101 and 102. Output harmonically tuned filter 107 comprises at least one reactive component, such as inductor 131, capacitor 119, capacitor 125, and inductor 137. Output harmonically tuned filter 107 can also comprise at least one resistive component, such as resistor 113. In the particular embodiment illustrated in FIG. 1, the first terminal of output harmonically tuned filter 107 is connected to a first terminal of inductor 131. A second terminal of inductor 131 is connected to a first terminal of capacitor 119. A second terminal of capacitor 119 is connected to a first terminal of resistor 113. A second terminal of resistor 113 is connected to a first terminal of capacitor 125. A second terminal of capacitor 125 is connected to a first terminal of inductor 137. A second terminal of inductor 137 is connected to the second terminal of output harmonically tuned filter 107.

Output harmonically tuned filter 108 is tuned to pass harmonic frequencies that would tend to cause odd-mode oscillation among amplifiers 102 and 103. Output harmonically tuned filter 108 comprises at least one reactive component, such as inductor 132, capacitor 120, capacitor 126, and inductor 138. Output harmonically tuned filter 108 can also comprise at least one resistive component, such as resistor 114. In the particular embodiment illustrated in FIG. 1, the first terminal of output harmonically tuned filter 108 is connected to a first terminal of inductor 132. A second terminal of inductor 132 is connected to a first terminal of capacitor 120. A second terminal of capacitor 120 is connected to a first terminal of resistor 114. A second terminal of resistor 114 is connected to a first terminal of capacitor 126. A second terminal of capacitor 126 is connected to a first terminal of inductor 138. A second terminal of inductor 138 is connected to the second terminal of output harmonically tuned filter 108.

Output harmonically tuned filter 109 is tuned to pass harmonic frequencies that would tend to cause odd-mode oscillation among amplifiers 103 and 101. Output harmonically tuned filter 109 comprises at least one reactive component, such as inductor 133, capacitor 121, capacitor 127, and inductor 139. Output harmonically tuned filter 109 can also comprise at least one resistive component, such as resistor 115. In the particular embodiment illustrated in FIG. 1, the first terminal of output harmonically tuned filter 109 is connected to a first terminal of inductor 133. A second terminal of inductor 133 is connected to a first terminal of capacitor 121. A second terminal of capacitor 121 is connected to a first terminal of resistor 115. A second terminal of resistor 115 is connected to a first terminal of capacitor 127. A second terminal of capacitor 127 is connected to a first terminal of inductor 139. A second terminal of inductor 139 is connected to the second terminal of output harmonically tuned filter 109.

In accordance with at least one embodiment, amplifiers 101, 102, and 103 comprise transistors. In accordance with at least one embodiment, more or fewer amplifiers 101, 102, and 103 may be provided as compared to the three shown in FIG. 1.

In accordance with at least one embodiment, as shown in FIG. 1, each of input harmonically tuned filters 104, 105, and 106 and each of output harmonically tuned filters 107, 108, and 109 comprises a series network of an inductor, a capacitor, a resistor, another capacitor, and another inductor. In accordance with at least one embodiment, any or all of input harmonically tuned filters 104, 105, and 106 and any or all of output harmonically tuned filters 107, 108, and 109 comprise a resistor, inductor, and capacitor (RLC) circuit having any number of resistors, inductors, and capacitors. Such elements can be explicitly fabricated on the semiconductor die or can be integrated into other components on the die. For example, capacitors may be integrated into transistors whose inputs or outputs they capacitively couple to the input harmonically tuned filters or output harmonically tuned filters. As another example, resistors may be integrated into transistors for which they absorptively attenuate energy at harmonically related frequencies or other frequencies at the input or outputs of the transistors. Inductors may be fabricated, for example, using wire bonds, where the length and shape of the wire bonds may be selected to tune the filters to the desired harmonic frequencies. Multiple wire bonds may be selected to have different lengths to provide increased bandwidth of the harmonically tuned filters. Inductors may be integrated into transistors to whose inputs or outputs they are coupled. By using, for example, integrated resistors, capacitors, and inductors, harmonically tuned filters can be fabricated monolithically with transistors that implement the amplifier gain elements. As another example, one or more of the resistors, capacitors, and inductors can be implemented using discrete components, including integrated passive devices. An RLC circuit of the input harmonically tuned filters or the output harmonically tuned filters can be configured as a lossy bandpass filter, such that frequencies outside the pass band are blocked from passing through the filter and frequencies in the pass band are absorptively attenuated by one or more resistors of the filter, as the resonance of the inductance and capacitance at frequencies in the pass band allows the filter to appear as the resistance of the resistor for frequencies within the pass band.

In accordance with at least one embodiment, both input harmonically tuned filters and output harmonically tuned filters are provided. In accordance with at least one other embodiment, output harmonically tuned filters are provided, but input harmonically tuned filters are replaced by resistors, for example, when power levels at the inputs to the amplifier elements are low enough that non-frequency-selective power dissipation of the resistors does not exceed the power handling ratings of the resistors.

In accordance with at least one embodiment, multiple instances of one or more of input harmonically tuned filters 104, 105, and 106 and multiple instances of one or more output harmonically tuned filters 107, 108, and 109 may be provided. A second instance of input harmonically tuned filter 104 is shown as input harmonically tuned filter 104' comprising inductor 128', capacitor 116', resistor 110', capacitor 122', and inductor 134'. A second instance of input harmonically tuned filter 105 is shown as input harmonically tuned filter 105' comprising inductor 129', capacitor 117', resistor 111', capacitor 123', and inductor 135'. A second instance of input harmonically tuned filter 106 is shown as input harmonically tuned filter 106' comprising inductor 130', capacitor 118', resistor 112', capacitor 124', and inductor 136'. A second instance of output harmonically tuned filter 107 is shown as output harmonically tuned filter 107' comprising inductor 131', capacitor 119', resistor 113', capacitor 125', and inductor 137'. A second instance of output harmonically tuned filter 108 is shown as output harmonically tuned filter 108' comprising inductor 132', capacitor 120', resistor 114', capacitor 126', and inductor 138'. A second instance of output harmonically tuned filter 109 is shown as output harmonically tuned filter 109' comprising inductor 133', capacitor 121', resistor 115', capacitor 127', and inductor 139'. For example, one instance of a harmonically tuned filter may be configured to pass one harmonic frequency, and another instance of a harmonically tuned filter may be configured to pass another harmonic frequency. Any number of such instances of harmonically tuned filters may be configured in parallel in place of any or all of input harmonically tuned filters 104, 105, and 106 and any or all of output harmonically tuned filters 107, 108, and 109. Multiple instances of harmonically tuned filters may be tuned to different harmonic frequencies or may be tuned to the same harmonic frequency, for example, to increase power handling capability of the combination of the multiple instances of harmonically tuned filters.

In accordance with at least one embodiment, for a system in which the at least two amplifiers 101, 102, and 103 are configured to operate with a bandwidth great enough that bandwidths of input harmonically tuned filters 104, 105, and 106 or output harmonically tuned filters 107, 108, and 109 are insufficient to span the frequency range of harmonic frequencies harmonically related to fundamental frequencies spanning the range of the amplifiers' bandwidth, multiple instances of one or more input harmonically tuned filters 104, 105, and 106 and multiple instances of one or more output harmonically tuned filters 107, 108, and 109 can be provided. The multiple instances of the one or more input harmonically tuned filters 104, 105, and 106 can collectively provide several bandpass filters configured in parallel with each other. The bandwidths of the multiple instances of the one or more input harmonically tuned filters 104, 105, and 106 can collectively provide a broader bandwidth sufficient to pass the harmonic frequencies related to the fundamental frequencies spanning the broad frequency range of the amplifiers' bandwidth. The multiple instances of the one or more output harmonically tuned filters 107, 108, and 109 can collectively provide several bandpass filters configured in parallel with each other. The bandwidths of the multiple instances of the one or more output harmonically tuned filters 107, 108, and 109 can collectively provide a broader bandwidth sufficient to pass the harmonic frequencies related to the fundamental frequencies spanning the broad frequency range of the amplifiers' bandwidth. Thus, at least one embodiment can accommodate wide bandwidth amplifier systems.

In accordance with at least one embodiment, harmonically tuned filters 104, 105, and 106 can be identical to one another. In accordance with at least one embodiment, harmonically tuned filters 104, 105, and 106 need not be identical. In accordance with at least one embodiment, harmonically tuned filters 107, 108, and 109 can be identical to one another. In accordance with at least one embodiment, harmonically tuned filters 107, 108, and 109 need not be identical. As an example, different filters can be tuned to at least one different pass band. As another example, different filters can introduce a phase shift between amplifiers, and the phase shifts can be different for at least one different filter.

While amplifiers 101, 102, and 103 are illustrated as operating in phase with one another, in accordance with at least one embodiment, at least one of the amplifiers can operate with a phase shift relative to at least one other of the amplifiers. As an example, at least one embodiment may provide at least one harmonically tuned filter between at least two amplifiers of a Doherty amplifier system.

The DC blocking provided by capacitors, such as capacitors 116 through 127, can support different types of amplifiers. For example, the DC blocking provided by the capacitors can accommodate inadvertent rectification that can occur in amplifiers. The DC blocking provided by the capacitors can accommodate imbalances in DC supply voltages among amplifier gain elements, as can occur, for example, with different voltage drops (e.g., current (I) times resistance (R) drops, referred to as IR drops) along different power supply paths to different amplifier gain elements.

In accordance with at least one embodiment, the quality (Q) of a harmonically tuned filter is matched to a bandwidth of the amplifier whose harmonics it filters. In one instance of such matching, the combined Q of a parallel combination of filter networks is matched to the bandwidth of the amplifier whose harmonics it filters.

As used herein, harmonic frequencies refer to frequencies that are harmonically related to a fundamental frequency, wherein the fundamental frequency is a frequency the amplifier elements are configured to amplify. Such harmonic frequencies may be actual harmonics of the fundamental frequency at frequencies that are integer multiples of the fundamental frequency, or such harmonic frequencies may be subharmonics of the fundamental frequency at frequencies that are integer submultiples of the fundamental frequency. At least one embodiment may be configured to suppress oscillation based on both actual harmonics and subharmonics, for example, by providing multiple instances of the harmonically tuned filters configured in parallel with each other, with at least one instance configured for at least one actual harmonic and at least one other instance configured for at least one subharmonic.

Figure 2:
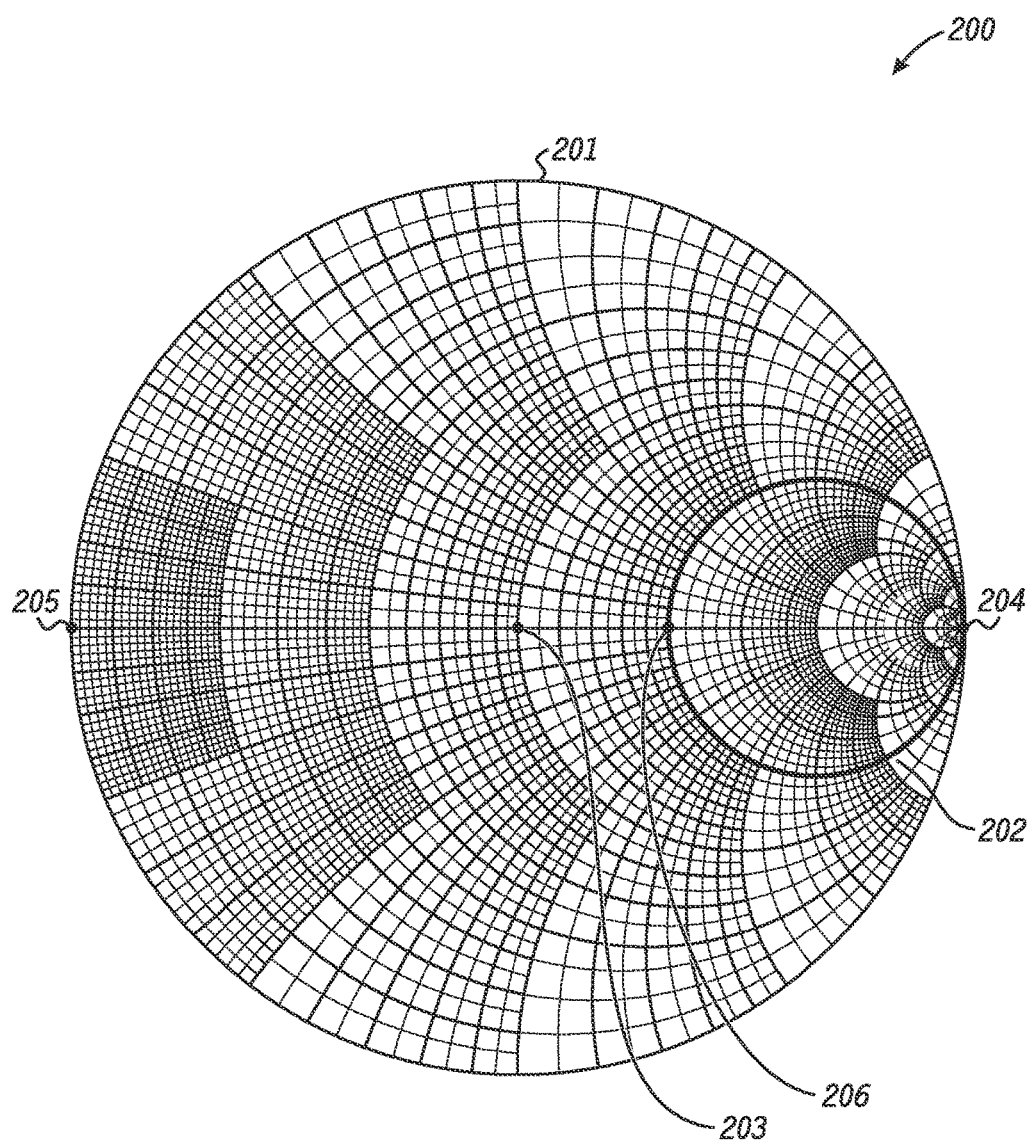
FIG. 2 is a Smith chart diagram illustrating complex impedance values of a harmonically tuned filter in accordance with at least one embodiment.

FIG. 2 is a Smith chart diagram illustrating complex impedance values of a harmonically tuned filter in accordance with at least one embodiment. Smith chart diagram 200 shows Smith chart 201 where zero impedance is depicted at point 205, infinite impedance is depicted at point 204, and a purely resistive impedance having a normalized value of unity is depicted at point 203. Circle 202 shows the values of impedance presented by an input harmonically tuned filter, such as one of input harmonically tuned filters 104, 105, and 106 of FIG. 1, or by an output harmonically tuned filter, such as one of output harmonically tuned filters 107, 108, and 109 of FIG. 1. The position along circle 202 is a function of frequency, with the leftmost point 206 along circle 202 representing the point of lowest impedance for the harmonically tuned filter, which occurs at the harmonically related frequency for which the harmonically tuned filter is tuned. As leftmost point 206 lies along the diametrical horizontal line that represents the real (e.g., resistive) axis of the Smith chart, the lowest impedance for harmonically tuned filter at leftmost point 206 can be purely resistive at the harmonically related frequency for which the harmonically tuned filter is tuned. Thus, the harmonically tuned filter can resistively attenuate any power that may be present at the harmonically related frequency for which the harmonically tuned filter is tuned while avoiding presenting an unnecessarily low impedance, and the consequent inefficiencies, at other frequencies.

Figure 3:
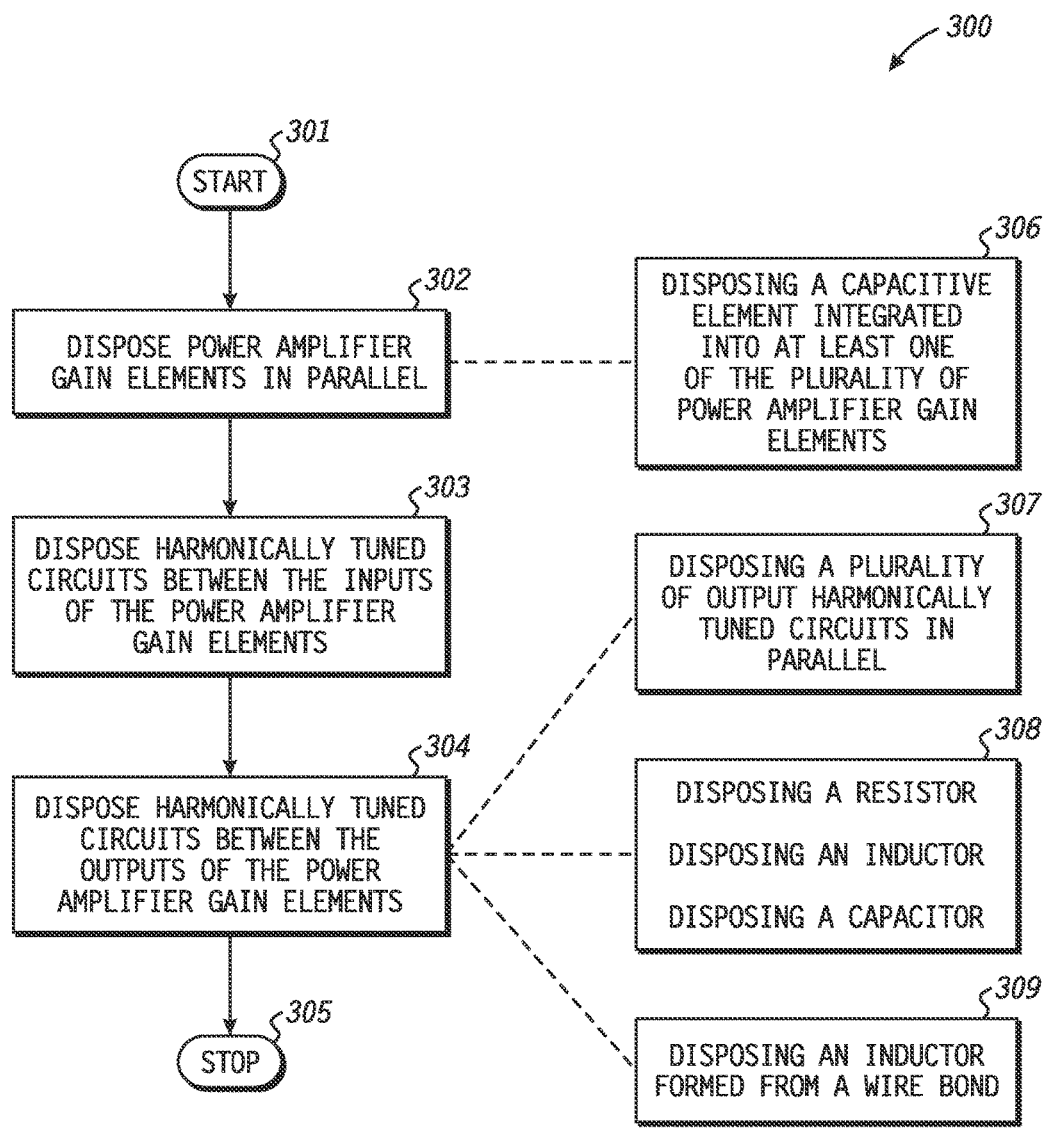
FIG. 3 is a flow diagram illustrating a method in accordance with at least one embodiment.

FIG. 3 is a flow diagram illustrating a method in accordance with at least one embodiment. Method 300 begins in block 301. From block 301, method 300 continues to block 302, where power amplifier gain elements (e.g., transistors 501-503, FIG. 5) are disposed in parallel (e.g., on a substrate, such as substrate 510, FIG. 5). From block 302, method 300 continues to block 303. In block 303, harmonically tuned circuits (e.g., circuits 504, 505, FIG. 5) are disposed between the inputs of the power amplifier gain elements (e.g., on a substrate, such as substrate 510, FIG. 5). The harmonically tuned circuits disposed between the inputs of the power amplifier gain elements can be configured to suppress energy at harmonically related frequencies harmonically related to a fundamental frequency at which the power amplifier gain elements operate based on a conduction angle of the power amplifier elements. From block 303, method 300 continues to block 304. In block 304, harmonically tuned circuits (e.g., circuits 507, 508) are disposed between the outputs of the power amplifier gain elements (e.g., on a substrate, such as substrate 510, FIG. 5). The harmonically tuned circuits disposed between the outputs of the power amplifier gain elements can be configured to suppress energy at harmonically related frequencies harmonically related to a fundamental frequency at which the power amplifier gain elements operate based on a conduction angle of the power amplifier elements. From block 304, method 300 continues to block 305, where method 300 ends.

In accordance with at least one embodiment, disposing power amplifier gain elements in parallel of block 302 can comprise disposing a capacitive element integrated into at least one of the plurality of power amplifier gain elements. The capacitive element can influence tuning of the output harmonically tuned filter to the at least one harmonic frequency which the harmonically tuned filter is configured to dissipate. In accordance with at least one embodiment, disposing harmonically tuned circuits between the outputs of the power amplifier gain elements of block 304 can comprise disposing a plurality of output harmonically tuned circuits in parallel of block 307; disposing a resistor, disposing an inductor, and disposing a capacitor of block 308; or disposing an inductor formed from a wire bond of block 309. The plurality of output harmonically tuned circuits in parallel of block 307 can include a second output harmonically tuned filter tuned to reduce energy at least another harmonic frequency and to avoid oscillation at the first transistor and at the second transistor. The at least another harmonic frequency can include a harmonic frequency of a second fundamental frequency within a bandwidth of the power amplifier gain elements so as to suppress parametric oscillation over the bandwidth of the power amplifier gain elements. The at least another harmonic frequency can include a harmonic frequency of a different order (e.g., the fifth harmonic of the fundamental frequency) than an order (e.g., the third harmonic of the fundamental frequency) of the harmonic frequency of the first output harmonically tuned filter configured in parallel with the second output harmonically tuned filter so as to suppress parametric oscillation for different orders of harmonics.

Figure 4:
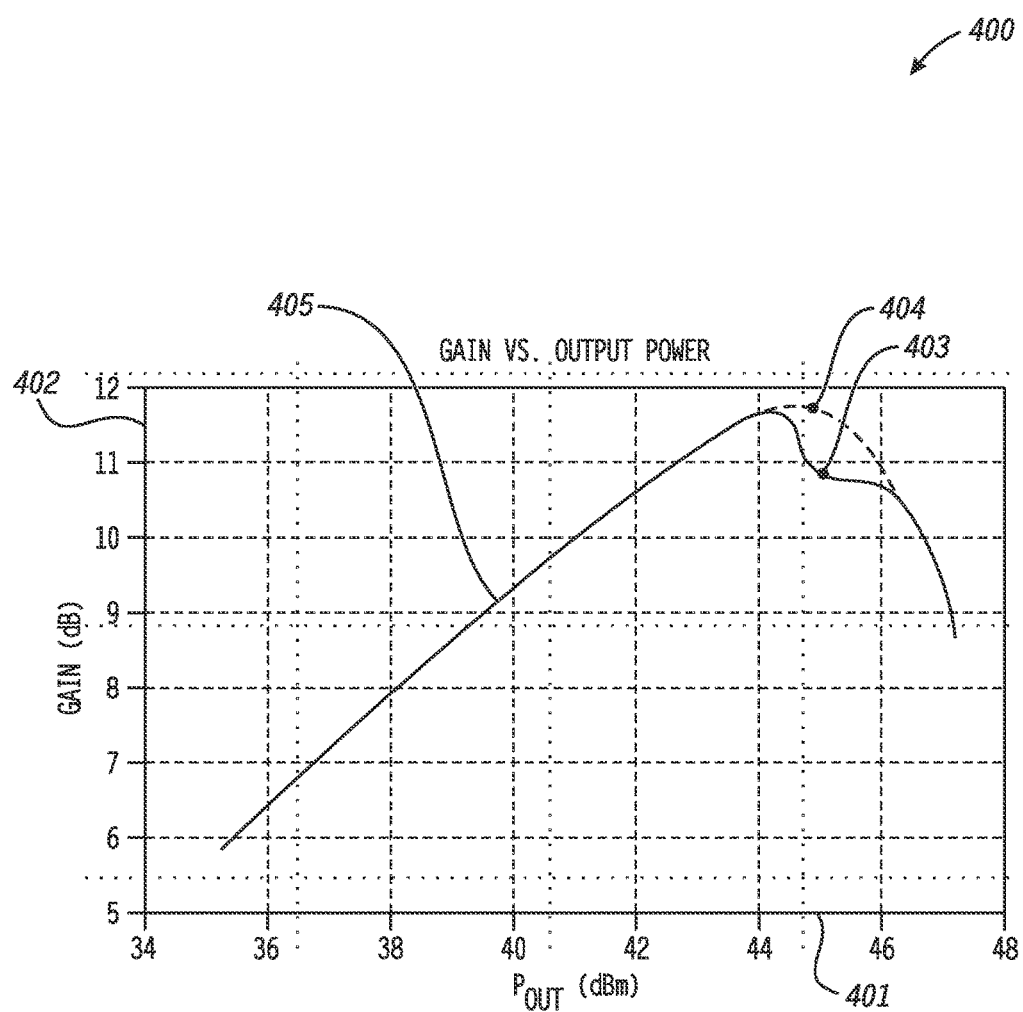
FIG. 4 is a graph illustrating performance in terms of gain vs. output power of a system comprising harmonically tuned filters in accordance with at least one embodiment.

FIG. 4 is a graph illustrating performance in terms of gain vs. output power of a system comprising harmonically tuned filters in accordance with at least one embodiment. Graph 400 shows performance curve 405 of a system comprising harmonically tuned filters in accordance with at least one embodiment. Performance curve 405 is plotted with respect to output power in decibels relative to a milliwatt (dBm) along horizontal axis 401 and gain in decibels (dB) of output power relative to input power along vertical axis 402. As can be seen by the difference between points 403 and 404 at approximately 45 dBm of output power, a bifurcation phenomenon occurs between approximately 44 and 46 dBm of output power. The bifurcation phenomenon is manifested by a discontinuity in the performance curve resulting in a drop in gain to point 403 as parametric oscillation, which can include odd-mode instability, in a system lacking harmonically tuned filters. When, instead, the system comprises harmonically tuned filters in accordance with at least one embodiment, the performance curve is smoother, provides optimal gain as power output is varied, avoids discontinuity in the performance curve, and does not exhibit the bifurcation phenomenon, as can be seen by the dashed line which includes point 404.

Figure 5:
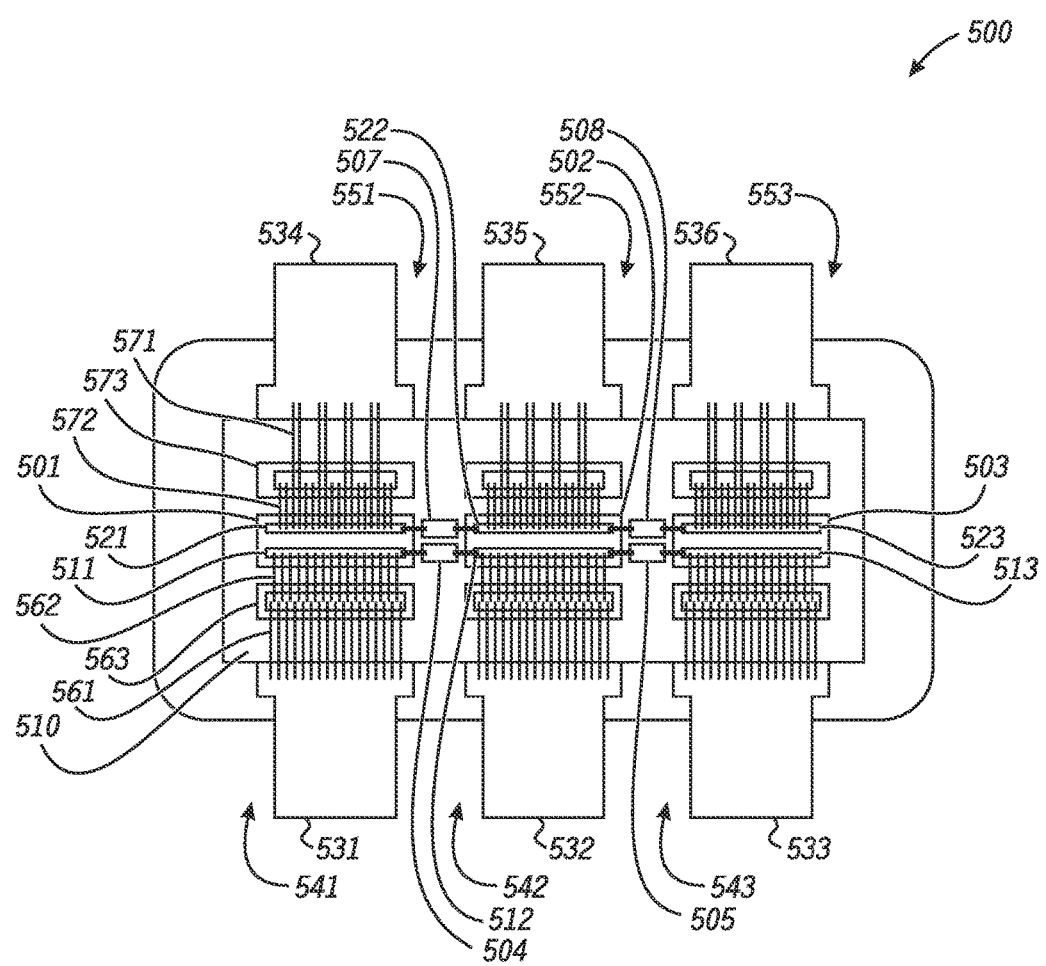
FIG. 5 is a top view of an interior of a device that includes three transistors and harmonically tuned filters coupling the gates and drains, respectively, of the three transistors in accordance with at least one embodiment.

In accordance with at least one embodiment, amplifier elements, such as transistors can be on a different semiconductor dies or on different tubs on the same semiconductor die. In accordance with at least one embodiment, capacitance for a harmonically tuned filter is integrated into each transistor. In accordance with at least one embodiment, resistance for a harmonically tuned filter is integrated into each transistor. At least one embodiment can be used in a system with any number of amplifier elements in parallel. In accordance with at least one embodiment having N amplifier elements in parallel, N input harmonically tuned filters and N output harmonically tuned filters may be used, such that each of the N amplifier elements is connected to two of the N input harmonically tuned filters and two of the N output harmonically tuned filters. An example of such an embodiment is shown in FIG. 1. In accordance with at least one embodiment having N amplifier elements in parallel, N−1 input harmonically tuned filters and N−1 output harmonically tuned filters may be used, such that each of the N amplifier elements is connected to two of the N−1 input harmonically tuned filters and two of the N−1 output harmonically tuned filters except for two of the N amplifier elements in parallel. An example of such an embodiment could be realized in accordance with FIG. 1 if input harmonically tuned filter 106 and output harmonically tuned filter 109 were omitted. Also, an example of such an embodiment is shown in FIG. 5.

At least one embodiment avoids odd-mode loop oscillation at multiple semiconductor dies or at die tubs of the same semiconductor die. In the case of avoiding odd-mode loop oscillation at multiple semiconductor dies, interconnects between the dies, for example, bonding wires, can be used as components in the RLC isolation circuit, for example, as inductors, or, as another example, as inductors and resistors or portions of a larger resistive network.

The global isolation provided by harmonically tuned filters configured across inputs or outputs of a plurality (e.g., three) of transistors in parallel can vary as a function of the isolation resistor value of the resistive components of RLC circuits placed between the transistors. For low resistor values (e.g., values less than 2.5 ohms in accordance with at least one embodiment), isolation is degraded. Performance can be similar to performance experienced when a single transistor is three times larger in periphery, as a larger transistor periphery yields lower isolation. With low resistor values, odd-mode instabilities can occur, where positive gain, instead of attenuation, occurs at harmonically related frequencies. For high resistor values (e.g., values greater than 10 ohms in accordance with at least one embodiment), isolation is degraded. Performance can be similar to that of three transistors combined in parallel, where the response of one transistor depends on the response of the other transistors. With high resistor values, odd-mode attenuation can be reduced, and, under some circumstances, odd-mode instabilities can occur.

For an optimal value resistor within an optimal resistor range (e.g., 2.5 to 10 ohms in accordance with at least one embodiment), optimal isolation can be achieved and stability can be maintained. The specific resistor value range depends on odd-mode impedances seen by the odd-mode resistor, and the RLC circuit can be configured accordingly. A lower power transistor arrangement can benefit from relatively higher resistor values, while higher power transistors can benefit from relatively lower resistor values. Thus, a resistor value of an isolation resistor of the RLC circuit can be scaled in accordance with characteristic impedances of the amplifier inputs and outputs to which the RLC circuit is connected.

FIG. 5 is a top view of an interior of a device 500 that includes three transistors 501, 502, and 503 (or power amplifier gain elements) and harmonically tuned filters 504, 505, 507, and 508 in accordance with at least one embodiment. Each of harmonically tuned filters 504 and 505 is coupled to two of gates 511, 512, and 513 of transistors 501, 502, and 503, respectively. Each of harmonically tuned filters 507 and 508 is coupled to two of drains 521, 522, and 523 of transistors 501, 502, and 503, respectively. The three transistors 501-503 and the harmonically tuned filters 504-508 are coupled to a substrate 510 (e.g., a conductive flange or other type of substrate), which provides a ground reference for the device 500.

Input and output leads 531, 532, 533, 534, 535, 536 are electrically isolated from the substrate 510 by an isolation structure 520, and the device may be capped to produce an air-cavity package. In an alternate embodiment, the device may be implemented as an overmolded device in which the transistors 501-503, filters 504-508, and other components are encapsulated with encapsulant material, and the encapsulant material may electrically isolate the substrate and leads. In still other alternate embodiments, a device may include only one input lead and only one output lead. Further, in alternate embodiments, a device may include as few as two transistors (or amplification paths) and as few as one harmonically tuned filter (e.g., coupling only the gates or drains of the transistors), or a device may include more than three transistors and associated harmonically tuned filters.

According to an embodiment, the transistors 501-503 may be LDMOS transistors implemented on separate semiconductor die, each of which is included as a gain element of one of three, parallel-coupled amplifiers (e.g., amplifiers 101, 102, 103, FIG. 1). In another embodiment, the transistors may be implemented in separate tubs of a single die. In addition, other types of transistors alternatively may be used.

In the embodiment illustrated in FIG. 5, the gates 511, 512, 513 of the transistors 501-503 each are coupled to an input lead 531, 532, 533 though an input impedance matching network 541, 542, 543, and the drains 521, 522, 523 of the transistors 501-503 each are coupled to an output lead 534, 535, 536 through an output impedance matching network 551, 552, 553. Each input impedance matching network 541-543 includes a pair of series coupled inductances (e.g., wirebonds 561, 562) coupled between the input lead 531-533 and the gate of a transistor (e.g., gate 511), and a shunt capacitor (e.g., capacitor 563) that is coupled between the inductances and a ground node (e.g., substrate 510). Each output impedance matching network 551-553 includes a first inductance (e.g., wirebonds 571) coupled between the drain of a transistor (e.g., drain 521) and the output lead 534-536, and a series coupled inductance (e.g., wirebonds 572) and capacitance (e.g., capacitor 573) coupled between the drain and the ground node. In alternate embodiments, either or both the input or output impedance matching networks 541-543, 551-553 may be excluded from a device (e.g., they may be implemented on a printed circuit board on which the device is mounted). In accordance with at least one embodiment the input lead 531, 532, 533 may be coupled together, for example, using an input combining metal bar (not shown in FIG. 5). As an example, the input lead 531, 532, 533 may be coupled together to the input combining metal bar via matching networks. As another example, the input lead 531, 532, 533 may be coupled together directly without matching networks. In accordance with at least one embodiment the output lead 534, 535, 536 may be coupled together, for example, using an output combining metal bar (not shown in FIG. 5). As an example, the output lead 534, 535, 536 may be coupled together to the output combining metal bar via matching networks. As another example, the output lead 534, 535, 536 may be coupled together directly without matching networks.

The gates 511-513 of transistors 501-513 are coupled together through harmonically tuned filters 504, 505, shown in simplified form. The inductances of the filters 504, 505 (e.g., inductances 128, 134, FIG. 1) may be provided substantially by wirebonds, as shown, and the capacitances and resistances of the filters 504, 505 (e.g., capacitances 116, 122 and resistance 110) may be provided by separate discrete components or by one or more integrated passive devices, in various embodiments. In an alternate embodiment, the resistances and/or capacitances may be integrated into the transistors 501-503.

Similarly, the drains 521-523 of transistors 501-513 are coupled together through harmonically tuned filters 507, 508, also shown in simplified form. The inductances of the filters 507, 508 (e.g., inductances 131, 137, FIG. 1) may be provided substantially by wirebonds, as shown, and the capacitances and resistances of the filters 507, 508 (e.g., capacitances 119, 125 and resistance 113) may be provided by separate discrete components or by one or more integrated passive devices, in various embodiments. In an alternate embodiment, the resistances and/or capacitances may be integrated into the transistors 501-503.

In accordance with at least one embodiment, a device comprises a plurality of transistors configured in parallel with one another and a first harmonically tuned filter coupled between a first transistor terminal of a first transistor of the plurality of transistors and a second transistor terminal of a second transistor of the plurality of transistors. The first harmonically tuned filter is tuned to reduce energy at least one harmonic frequency. The first transistor terminal and the second transistor terminal are selected from a group consisting of a first transistor input and a second transistor input, respectively, and a first transistor output and a second transistor output, respectively. Thus, the first harmonically tuned filter may be coupled between the first transistor input and the second transistor input, or the first harmonically tuned filter may be coupled between the first transistor output and the second transistor output.

In accordance with at least one embodiment, the device further comprises a second harmonically tuned filter coupled between the first transistor and the second transistor. The first harmonically tuned filter is coupled between the first transistor output and the second transistor output. The second harmonically tuned filter is coupled between the first transistor input and the second transistor input.

In accordance with at least one embodiment, the device further comprises a second harmonically tuned filter coupled between the first transistor output and the second transistor output. The second harmonically tuned filter is tuned to reduce energy at at least another harmonic frequency and to avoid oscillation at the first transistor and at the second transistor. The first harmonically tuned filter is also coupled between the first transistor output and the second transistor output.

In accordance with at least one embodiment, the first harmonically tuned filter comprises a resistor, an inductor, and a capacitor coupled in series with one another as a series resistor, inductor, and capacitor (RLC) circuit. In accordance with at least one embodiment, the first harmonically tuned filter comprises an inductor, the inductor formed from a wire bond. The wire bond has a length configured to tune the first harmonically tuned filter to the at least one harmonic frequency.

In accordance with at least one embodiment, the device further comprises a capacitive element integrated into at least one of the plurality of transistors. The capacitive element influences tuning of the first harmonically tuned filter to the at least one harmonic frequency.

In accordance with at least one embodiment, the first transistor is fabricated on a first semiconductor die and the second transistor is fabricated on a second semiconductor die. The first harmonically tuned filter comprises an inductor formed by a wire bond configured to tune the first harmonically tuned filter to the at least one harmonic frequency. The wire bond is connected between the first semiconductor die and the second semiconductor die.

In accordance with at least one embodiment, a system comprises a first amplifier element having a first amplifier element input and a first amplifier element output, a second amplifier element, and a first harmonically tuned filter. The first amplifier element is for amplifying a signal comprising a fundamental frequency. The second amplifier element has a second amplifier element input and a second amplifier element output. The second amplifier element is for amplifying the signal comprising the fundamental frequency. The second amplifier element is configured in parallel with the first amplifier element. The first harmonically tuned filter has a first terminal and a second terminal coupled to a first amplifier element terminal and a second amplifier terminal, respectively, selected from a group consisting of the first amplifier element input and the second amplifier element input, respectively, and the first amplifier element output and the second amplifier element output, respectively. Thus, the first harmonically tuned filter may be coupled between the first amplifier element input and the second amplifier element input, or the first harmonically tuned filter may be coupled between the first amplifier element output and the second amplifier element output. The first harmonically tuned filter is tuned to reduce energy at least one harmonic frequency harmonically related to the fundamental frequency.

In accordance with at least one embodiment, the system further comprises at least one additional amplifier element and a second harmonically tuned filter. The at least one additional amplifier element has an additional amplifier element input and an additional amplifier element output. The at least one additional amplifier element is for amplifying the signal comprising the fundamental frequency. The at least one additional amplifier element is configured in parallel with the first amplifier element and in parallel with the second amplifier element. The second harmonically tuned filter is coupled between the second amplifier element and the additional amplifier element. The second harmonically tuned filter is tuned to reduce energy at the at least one harmonic frequency.

In accordance with at least one embodiment, the system further comprises a third harmonically tuned filter. The at least one additional amplifier element comprises a final additional amplifier element. The final additional amplifier element has a final additional amplifier element input and a final additional amplifier element output. The third harmonically tuned filter is coupled between the final additional amplifier element output and the first amplifier element output. The third harmonically is tuned filter tuned to reduce energy at the at least one harmonic frequency.

In accordance with at least one embodiment, the system further comprises an additional instance of the first harmonically tuned filter. The additional instance of the first harmonically tuned filter is coupled between the first amplifier element and the second amplifier element in parallel with the first harmonically tuned filter. The additional instance of the first harmonically tuned filter is tuned to reduce energy at least one other harmonic frequency. The at least one other harmonic frequency is harmonically related to the fundamental frequency but different from the at least one harmonic frequency.

In accordance with at least one embodiment, the first harmonically tuned filter comprises a resistor, an inductor, and a capacitor in series with one another as a series resistor, inductor and capacitor (RLC) circuit. In accordance with at least one embodiment, the first harmonically tuned filter comprises an inductor, the inductor formed from a wire bond. The wire bond has a length configured to tune the first harmonically tuned filter to the at least one harmonic frequency.

In accordance with at least one embodiment, the system further comprises a capacitive element. The capacitive element is integrated into at least one of the first amplifier element and the second amplifier element. The capacitive element influences tuning of the first harmonically tuned filter to the at least one harmonic frequency.

In accordance with at least one embodiment, a method comprises disposing a plurality of power amplifier gain elements in parallel and disposing a first harmonically tuned circuit between different ones of the plurality of power amplifier gain elements. The plurality of power amplifier gain elements is configured to amplify a signal comprising a fundamental frequency. The first harmonically tuned circuit is tuned to reduce energy at least one harmonic frequency harmonically related to the fundamental frequency.

In accordance with at least one embodiment, the method further comprises disposing a second harmonically tuned circuit between the different ones of the plurality of power amplifier gain elements. The second harmonically tuned circuit is tuned to reduce energy at the at least one harmonic frequency. The first harmonically tuned circuit is coupled between power amplifier gain element outputs of the power amplifier gain elements. The second harmonically tuned circuit is coupled between power amplifier gain element inputs of the power amplifier gain elements.

In accordance with at least one embodiment, the disposing the first harmonically tuned circuit between the different ones of the plurality of power amplifier gain elements comprises disposing a plurality of harmonically tuned circuits in parallel with each other between the different ones of the plurality of power amplifier gain elements. Different ones of the plurality of harmonically tuned circuits are tuned to different ones of harmonic frequencies. The harmonic frequencies are harmonically related to the fundamental frequency.

In accordance with at least one embodiment, the disposing the first harmonically tuned circuit between the different ones of the plurality of power amplifier gain elements further comprises disposing a resistor to form a first component of the first harmonically tuned circuit, disposing an inductor to form a second component of the first harmonically tuned circuit, and disposing a capacitor to form a second component of the first harmonically tuned circuit. The first harmonically tuned filter comprises a lossy bandpass filter circuit formed from the resistor, the inductor, and the capacitor.

In accordance with at least one embodiment, the disposing the first harmonically tuned circuit between the different ones of the plurality of power amplifier gain elements further comprises disposing an inductor as a component of the first harmonically tuned circuit. The inductor is formed from a wire bond. The wire bond has a length configured to tune the first harmonically tuned filter to the at least one harmonic frequency.

In accordance with at least one embodiment, the disposing a plurality of power amplifier gain elements in parallel further comprises disposing a capacitive element integrated into at least one of the plurality of power amplifier gain elements. The capacitive element influences tuning of the first harmonically tuned filter to the at least one harmonic frequency.

What is claimed is:

1. A device comprising:
a plurality of transistors configured in parallel with one another; and
a first harmonically tuned filter coupled between a first transistor terminal of a first transistor of the plurality of transistors and a second transistor terminal of a second transistor of the plurality of transistors, wherein the first transistor comprises a first transistor input and a first transistor output and the second transistor comprises a second transistor input and a second transistor output, the first harmonically tuned filter includes a first resistor, and the first harmonically tuned filter is tuned to allow energy at least one harmonic frequency of a fundamental frequency at which the plurality of transistors provide amplification to pass through the first harmonically tuned filter to be dissipated by the first resistor, the first harmonically tuned filter blocking direct current (DC) from being dissipated by the first resistor, and wherein the first transistor terminal and the second transistor terminal are selected from a group consisting of the first transistor input and the second transistor input, respectively, and the first transistor output and the second transistor output, respectively.

2. The device of claim 1 further comprising:
a second harmonically tuned filter coupled between the first transistor and the second transistor, wherein the first harmonically tuned filter is coupled between the first transistor output and the second transistor output and the second harmonically tuned filter is coupled between the first transistor input and the second transistor input.

3. The device of claim 1 further comprising:
a second harmonically tuned filter coupled between the first transistor output and the second transistor output, wherein the second harmonically tuned filter includes a second resistor, and the second harmonically tuned filter is tuned to allow energy at least another harmonic frequency of the fundamental frequency to pass through the second harmonically tuned filter to be dissipated by the second resistor, wherein the first harmonically tuned filter is also coupled between the first transistor output and the second transistor output, wherein the first transistor terminal is the first transistor output and wherein the second transistor terminal is the second transistor output.

4. A device comprising:
a plurality of transistors configured in parallel with one another; and
a first harmonically tuned filter coupled between a first transistor terminal of a first transistor of the plurality of transistors and a second transistor terminal of a second transistor of the plurality of transistors, wherein the first transistor comprises a first transistor input and a first transistor output and the second transistor comprises a second transistor input and a second transistor output, the first harmonically tuned filter is tuned to allow energy at least one harmonic frequency of a fundamental frequency at which the plurality of transistors provide amplification to pass through the first harmonically tuned filter, wherein the first harmonically tuned filter comprises a resistor, an inductor, and a capacitor coupled in series with one another as a series resistor, inductor, and capacitor (RLC) circuit, and wherein the first transistor terminal and the second transistor terminal are selected from a group consisting of the first transistor input and the second transistor input, respectively, and the first transistor output and the second transistor output, respectively.

5. The device of claim 1 wherein the first harmonically tuned filter comprises an inductor, the inductor formed from a bond wire, the bond wire having a length configured to tune the first harmonically tuned filter to the at least one harmonic frequency.

6. The device of claim 1 further comprising:
a capacitive element integrated into at least one of the plurality of transistors, the capacitive element influencing tuning of the first harmonically tuned filter to the at least one harmonic frequency.

7. The device of claim 1 wherein the first transistor is fabricated on a first semiconductor die and the second transistor is fabricated on a second semiconductor die, wherein the first harmonically tuned filter comprises an inductor formed by a bond wire configured to tune the first harmonically tuned filter to the at least one harmonic frequency, wherein the bond wire is connected between the first semiconductor die and the second semiconductor die.

8. A system comprising:
a first amplifier element having a first amplifier element input and a first amplifier element output, the first amplifier element for amplifying a signal comprising a fundamental frequency;
a second amplifier element having a second amplifier element input and a second amplifier element output, the second amplifier element for amplifying the signal comprising the fundamental frequency, the second amplifier element configured in parallel with the first amplifier element; and
a first harmonically tuned filter having a first terminal and a second terminal coupled to a first amplifier element terminal and a second amplifier terminal, respectively, selected from a group consisting of the first amplifier element input and the second amplifier element input, respectively, and the first amplifier element output and the second amplifier element output, respectively, wherein the first harmonically tuned filter includes a first resistor, and the first harmonically tuned filter is tuned to allow energy at least one harmonic frequency harmonically related to the fundamental frequency to pass through the first harmonically tuned filter to be dissipated by the first resistor, the first harmonically tuned filter blocking direct current (DC) from being dissipated by the first resistor.

9. The system of claim 8 further comprising:
at least one additional amplifier element having an additional amplifier element input and an additional amplifier element output, the at least one additional amplifier element for amplifying the signal comprising the fundamental frequency, the at least one additional amplifier element configured in parallel with the first amplifier element and in parallel with the second amplifier element; and
a second harmonically tuned filter coupled between the second amplifier element and the additional amplifier element, wherein the second harmonically tuned filter includes a second resistor, and the second harmonically tuned filter is tuned to allow energy at the at least one harmonic frequency to pass through the second harmonically tuned filter to be dissipated by the second resistor.

10. The system of claim 9 further comprising:
a third harmonically tuned filter, wherein the at least one additional amplifier element comprises a final additional amplifier element having a final additional amplifier element input and a final additional amplifier element output, the third harmonically tuned filter coupled between the final additional amplifier element output and the first amplifier element output, the third harmonically tuned filter including a third resistor, and the third harmonically tuned filter tuned to allow energy at the at least one harmonic frequency to pass through the third harmonically tuned filter to be dissipated by the third resistor.

11. The system of claim 8 further comprising:
a second harmonically tuned filter coupled between the first amplifier element and the second amplifier element in parallel with the first harmonically tuned filter, the second harmonically tuned filter including a second resistor, and the second harmonically tuned filter tuned to allow energy at least one other harmonic frequency harmonically related to the fundamental frequency but different from the at least one harmonic frequency to pass through the second harmonically tuned filter to be dissipated by the second resistor.

12. A system comprising:
a first amplifier element having a first amplifier element input and a first amplifier element output, the first amplifier element for amplifying a signal comprising a fundamental frequency;
a second amplifier element having a second amplifier element input and a second amplifier element output, the second amplifier element for amplifying the signal comprising the fundamental frequency, the second amplifier element configured in parallel with the first amplifier element; and
a first harmonically tuned filter having a first terminal and a second terminal coupled to a first amplifier element terminal and a second amplifier terminal, respectively, selected from a group consisting of the first amplifier element input and the second amplifier element input, respectively, and the first amplifier element output and the second amplifier element output, respectively, wherein the first harmonically tuned filter is tuned to allow energy at least one harmonic frequency harmonically related to the fundamental frequency to pass through the first harmonically tuned filter, and wherein the first harmonically tuned filter comprises a resistor, an inductor, and a capacitor in series with one another as a series resistor, inductor and capacitor (RLC) circuit.

13. The system of claim 8 wherein the first harmonically tuned filter comprises an inductor, the inductor formed from a bond wire, the bond wire having a length configured to tune the first harmonically tuned filter to the at least one harmonic frequency.

14. The system of claim 8 further comprising:
a capacitive element integrated into at least one of the first amplifier element and the second amplifier element, the capacitive element influencing tuning of the first harmonically tuned filter to the at least one harmonic frequency.

15. A method comprising:
disposing a plurality of power amplifier gain elements in parallel, the plurality of power amplifier gain elements configured to amplify a signal comprising a fundamental frequency; and
disposing a first harmonically tuned circuit between different ones of the plurality of power amplifier gain elements, the first harmonically tuned circuit including a first resistor, and the first harmonically tuned filter is tuned to allow energy at least one harmonic frequency harmonically related to the fundamental frequency to pass through the first harmonically tuned filter to be dissipated by the first resistor, the first harmonically tuned filter blocking direct current (DC) from being dissipated by the first resistor.

16. The method of claim 15 further comprising:
disposing a second harmonically tuned circuit between the different ones of the plurality of power amplifier gain elements, the second harmonically tuned circuit including a second resistor, and the second harmonically tuned filter is tuned to allow energy at the at least one harmonic frequency to pass through the second harmonically tuned filter to be dissipated by the second resistor, wherein the first harmonically tuned circuit is coupled between power amplifier gain element outputs of the power amplifier gain elements and the second harmonically tuned circuit is coupled between power amplifier gain element inputs of the power amplifier gain elements.

17. The method of claim 15 wherein the disposing the first harmonically tuned circuit between the different ones of the plurality of power amplifier gain elements comprises:
disposing a plurality of harmonically tuned circuits in parallel with each other between the different ones of the plurality of power amplifier gain elements, wherein different ones of the plurality of harmonically tuned circuits are tuned to different ones of harmonic frequencies, the harmonic frequencies being harmonically related to the fundamental frequency.

18. A method comprising:
disposing a plurality of power amplifier gain elements in parallel, the plurality of power amplifier gain elements configured to amplify a signal comprising a fundamental frequency; and
disposing a first harmonically tuned circuit between different ones of the plurality of power amplifier gain elements, the first harmonically tuned circuit tuned to reduce energy at least one harmonic frequency harmonically related to the fundamental frequency, wherein the disposing the first harmonically tuned circuit between the different ones of the plurality of power amplifier gain elements includes
disposing a resistor to form a first component of the first harmonically tuned circuit,
disposing an inductor to form a second component of the first harmonically tuned circuit, and
disposing a capacitor to form a third component of the first harmonically tuned circuit, wherein the first harmonically tuned filter comprises a lossy bandpass filter circuit formed from the resistor, the inductor, and the capacitor.

19. The method of claim 15 wherein the disposing the first harmonically tuned circuit between the different ones of the plurality of power amplifier gain elements further comprises:
disposing an inductor as a component of the first harmonically tuned circuit, the inductor formed from a bond wire, the bond wire having a length configured to tune the first harmonically tuned filter to the at least one harmonic frequency.

20. The method of claim 15 wherein the disposing a plurality of power amplifier gain elements in parallel further comprises:
disposing a capacitive element integrated into at least one of the plurality of power amplifier gain elements, the capacitive element influencing tuning of the first harmonically tuned filter to the at least one harmonic frequency.

* * * * *